United States Patent
Shibuya (10) Patent No.: US 9,207,266 B2
(45) Date of Patent: Dec. 8, 2015

(54) POWER CONSUMPTION MANAGEMENT SYSTEM

(75) Inventor: Tenda Shibuya, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 14/008,526

(22) PCT Filed: Mar. 30, 2012

(86) PCT No.: PCT/JP2012/058557
§ 371 (c)(1),
(2), (4) Date: Sep. 27, 2013

(87) PCT Pub. No.: WO2012/133756
PCT Pub. Date: Oct. 4, 2012

(65) Prior Publication Data
US 2014/0015514 A1 Jan. 16, 2014

(30) Foreign Application Priority Data
Mar. 31, 2011 (JP) .................................. 2011-077732

(51) Int. Cl.
*G01R 19/00* (2006.01)
*G01R 15/09* (2006.01)

(52) U.S. Cl.
CPC ............ *G01R 19/0092* (2013.01); *G01R 15/09* (2013.01)

(58) Field of Classification Search
CPC ..... G01R 19/0092; G01R 19/00; G01R 13/00
USPC ................. 324/76.11, 764.01, 140, 127, 509; 702/62
See application file for complete search history.

(56) References Cited

U.S. PATENT DOCUMENTS

| | | | | |
|---|---|---|---|---|
| 5,309,312 A | * | 5/1994 | Wilkerson et al. | 361/79 |
| 6,392,858 B1 | * | 5/2002 | Boudaud | 361/93.6 |
| 7,508,653 B2 | * | 3/2009 | Parlee | 361/652 |
| 2005/0083616 A1 | * | 4/2005 | Reid et al. | 361/42 |
| 2006/0095219 A1 | * | 5/2006 | Bruno | 702/64 |

(Continued)

FOREIGN PATENT DOCUMENTS

| | | |
|---|---|---|
| CN | 101416364 A | 4/2009 |
| JP | A-58-063864 | 4/1983 |

(Continued)

OTHER PUBLICATIONS

International Search Report of PCT/JP2012/058557 mailed Jul. 3, 2012.

(Continued)

*Primary Examiner* — Huy Q Phan
*Assistant Examiner* — Thang Lee
(74) *Attorney, Agent, or Firm* — Wilmer Cutler Pickering Hale and Dorr LLP (57) ABSTRACT

A power consumption management system includes: a main part that is connected to a power line; a breaker that is electrically connected to the main part, and limits a current supplied to a load to a predetermined set value; a sensor unit including a current sensor and a signal processing part. The current sensor measures a current supplied from the main part to the breaker, and outputs a current detection signal based on the measured current. The signal processing part receives the current detection signal over a predetermined time, determines a range of a signal level from the received current detection signal, and adjusts an input range of the current detection signal in accordance with the determination result.

4 Claims, 6 Drawing Sheets

(56) References Cited

U.S. PATENT DOCUMENTS

2010/0207604 A1* 8/2010 Bitsch et al. ............... 324/140 R
2010/0295540 A1* 11/2010 Bowman ........................ 324/127
2010/0308792 A1* 12/2010 Rupert et al. .............. 324/76.77

FOREIGN PATENT DOCUMENTS

| JP | A-2001-218313 | 8/2001 |
| JP | 2001-289884 A | 10/2001 |
| JP | A-2002-116052 | 4/2002 |
| JP | U-3125999 | 10/2006 |
| JP | A-2010-096777 | 4/2010 |
| JP | A-2010-130735 | 6/2010 |

OTHER PUBLICATIONS

Office Action issued by the Japan Patent Office for Application No. 2013-507776 mailed Jul. 15, 2014 (5 pgs.).

Chinese Office Action issued by the State Intellectual Property Office of the People's Republic of China for Application No. 201280015422.5 mailed on Nov. 25, 2014 (16 pages).

Japanese Office Action issued by the Japanese Patent Office for Application No. 2013-507776 dated Mar. 3, 2015 (4 pages).

* cited by examiner

POWER CONSUMPTION MANAGEMENT SYSTEM

CROSS-REFERENCE TO RELATED APPLICATIONS

This application is a national stage application of International Application No. PCT/JP2012/058557, filed on Mar. 30, 2012, which claims the benefit of the priority of Japanese patent application No. 2011-077732, filed on Mar. 31, 2011, the disclosures of each of which are hereby incorporated by reference in their entirety.

TECHNICAL FIELD

The present invention relates to a power consumption management system that is applicable to a power distribution board.

BACKGROUND ART

Figure 5:
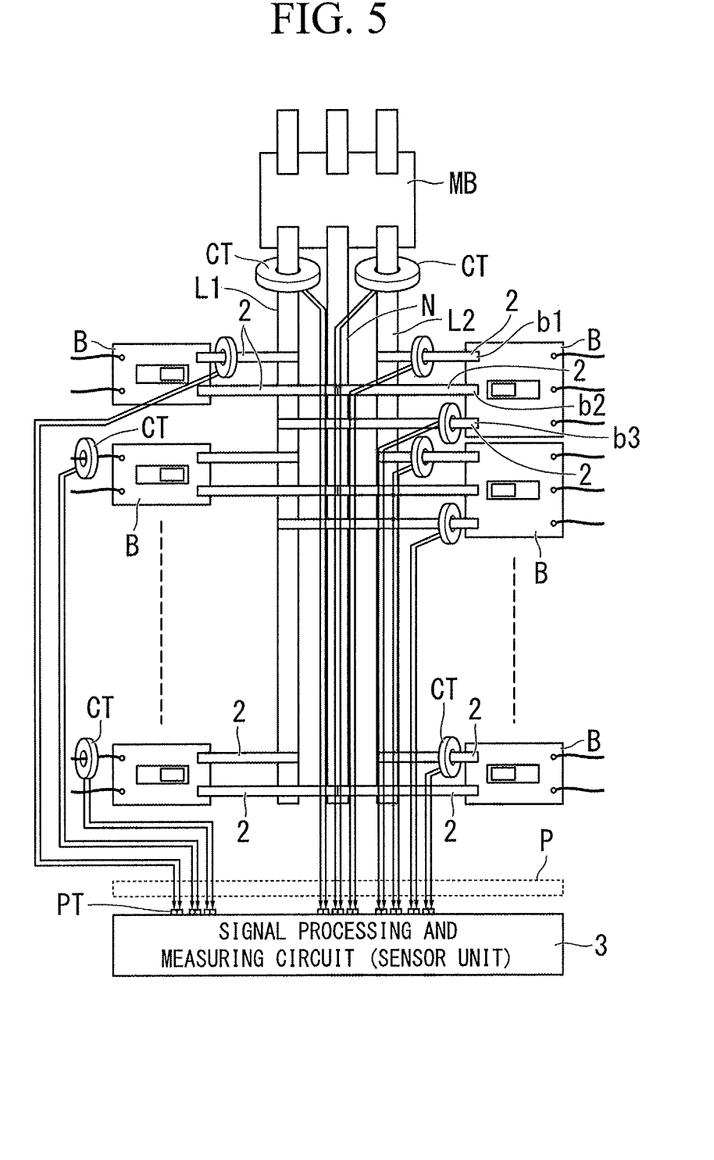
FIG. 5 is a configuration diagram that shows an example of an ordinary sensor-equipped power distribution board that includes a function of measuring electrical current or electrical power.
Figure 6:
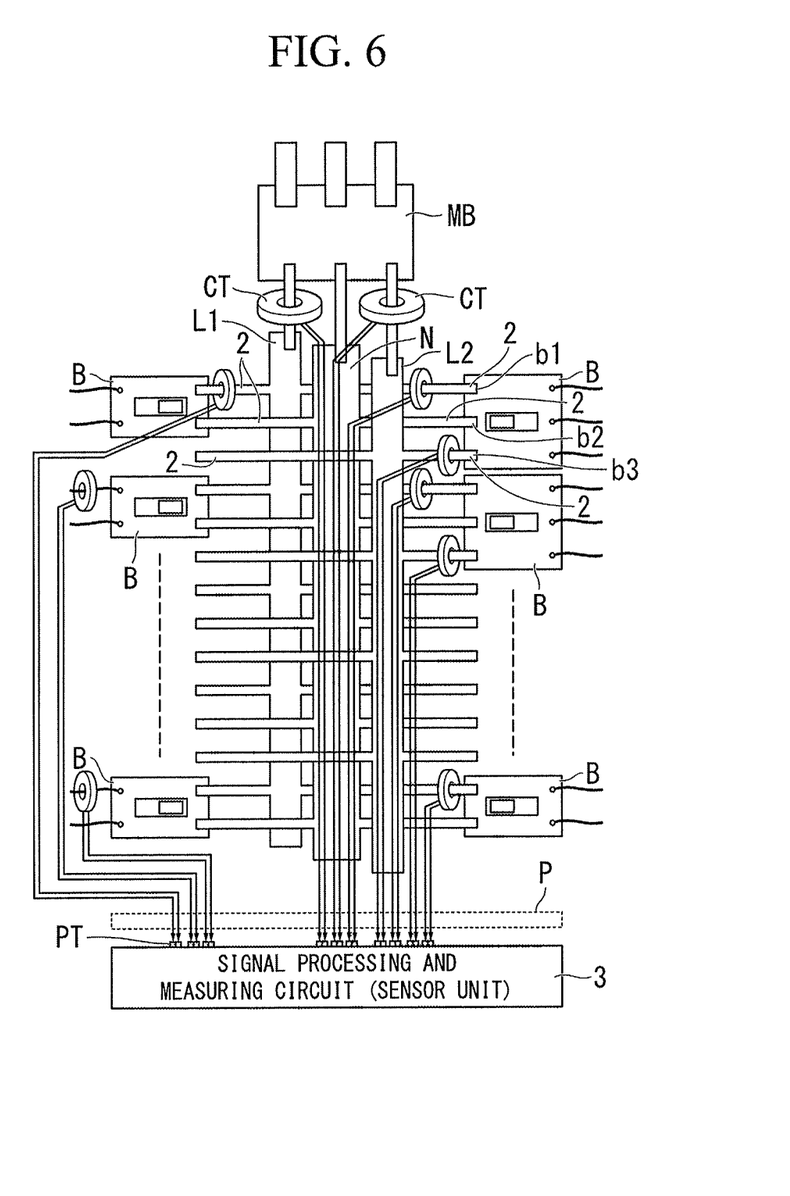
FIG. 6 is a configuration diagram that shows another example of an ordinary sensor-equipped power distribution board that includes a function of measuring electrical current or electrical power.

Heretofore there is known a power distribution board with sensors shown in FIG. 5 or FIG. 6 that includes a function of measuring electrical current or power. The power distribution board that is shown in FIG. 5 or FIG. 6 includes a trunk breaker MB, a plurality of main bars (or main plates, abbreviated below) L1, L2, N, a plurality or branch bars (or branch plates, abbreviated below) 2, a plurality of branch breakers B, a plurality of through-type or clamp-type current sensors CT, a plurality of signal transport paths P, a plurality of input signal ports PT, and a signal processing and measuring circuit (hereinbelow called a sensor unit) 3. The plurality of main bars L1, L2, N are connected to the load-side terminals of the trunk breaker MB. The plurality of branch bars 2 extend from the main mars L1, L2, N. The plurality of branch breakers B are connected to the plurality of branch bars 2. The branch bars 2 are joined to the branch breakers B and the main bars L1, L2, N. The current sensors CT are installed to electrical lines that are connected from the branch bars 2 or the load side terminals of the trunk breaker MB to the load. The plurality of signal transport paths P transport detection signals that are output from the current sensors CT. The input signal ports PT take in the detection signals that are output from the current sensors CT and transported through the signal transport paths P. The sensor unit 3 performs processing and measuring of the detection signals that are taken in by the input signal ports PT.

PRIOR ART DOCUMENTS

Patent Document

[Patent Document 1] Japanese Unexamined Patent Application, First Publication No. 2010-130735

SUMMARY OF THE INVENTION

Problem to be Solved by the Invention

In the power distribution board described above, it is not possible to automatically specify which branch breakers B and which input signal ports PT the plurality of current sensors CT are connected to. For this reason, it has been necessary to initialize the correspondence relation of a given arbitrary branch breaker B, current sensor CT, and input signal port PT with respect to the sensor unit 3 manually or with association definition data or the like that is created manually in advance. Moreover, attaching meaning and attaching correspondence to each measurement data as the measurement result of the sensor unit 3 has been required. As a result, there has been the issue of requiring work entailing tremendous labor. Also, in the case of performing conservative work of increasing and replacing current sensors, in the same way there has been the issue of requiring work entailing tremendous labor.

Furthermore, when a current detection signal from the current sensor CT is input to the sensor unit 3 by consumption current or power consumption of the load that is connected to the breakers (trunk breaker MB, branch breakers B), that input range (sensitivity, dynamic range) varies depending on the load that is connected. For that reason, there has been the problem of not being able to accurately measure electrical current.

The present invention has been achieved in view of the circumstances given above. One exemplary object of the present invention is to provide a power consumption management system in which a sensor unit itself automatically recognizes the correspondence of a given branch breaker, current sensor and input signal port without relying on manual effort, and can perform the attachment of meaning and correspondence of each measured data as a measurement result. Also, one exemplary object of the present invention is to provide a power consumption management system that, in the event of a current detection signal from the current sensor being input to the sensor unit 3 by consumption current or power consumption of a load that is connected to a breaker (trunk breaker MB, branch breaker B), that input range (sensitivity, dynamic range) varies depending on the connected load, but by monitoring and judging those values, can automatically adjust the input range (sensitivity, dynamic range) and perform accurate current measurement.

Means for Solving the Problem

A power consumption management system according to one exemplary aspect of the present invention includes a power distribution board including a plurality of main bars, a plurality of branch bars, a plurality of branch breakers, electrical wiring, a plurality of current sensors, a plurality of signal transport paths, an input signal port, and a sensor unit. The plurality of main bars are connected to load side terminals of a trunk breaker. The plurality of branch bars extend out from the main bars, and join the branch breakers and the main bars. The plurality of branch breakers are connected to the plurality of branch bars. The electrical wiring is connected from the load side terminal to the load. The plurality of current sensors are through-type or clamp-type current sensors, and are installed at the branch bar or the electrical wiring. The plurality of signal transport paths transport detection signals that are output from the current sensors. The plurality of input signal ports take in the detection signals. The sensor unit processes the detection signals. The power distribution board has a mechanism that outputs a sensor/location correspondence signal that links the physical locations of a current sensor and the breaker, and recognizes this signal with a sensor unit. With this constitution, the sensor unit itself can automatically recognize the correspondence of a given branch breaker, current sensor and input signal port without relying on manual effort, and can perform attachment of meaning and attachment of correspondence of each measured data as a measurement result. Also, in the event of a current detection signal from a current sensor being input to the sensor unit by consumption current or power consumption of a load that is connected to the breaker (trunk breaker, branch breaker), that input range (sensitivity, dynamic range)

varies depending on the connected load. The power consumption management system has a mechanism that can monitor and determine the value of the current detection signal for a fixed time (a period that corresponds to an operation cycle that includes the maximum value and minimum value), and adjust the input range (sensitivity, dynamic range) so as to become an output level having the greatest resolution. With this constitution, it is possible to perform automatic adjustment and accurate current measurement.

Effect of the Invention

According to an exemplary embodiment of the present invention, a sensor unit itself can automatically recognize the correspondence of a given branch breaker, current sensor and input signal port without relying on manual effort, and can perform attachment of meaning and attachment of correspondence of each measured data as a measurement result. For example, a short pin that drives a signal that uniquely shows the attachment position to a receiving connector as the receiving port of the current detection signal of the current sensor is provided at the position of an arbitrary breaker. The selection line that is output from the encoder that selects the short pin of an arbitrary receiving connector that is output from the sensor unit is in an open state during non-selection, and in a conduction state and grounded state during selection. With this constitution, in the state of a transmission connector of the current detection signal of an arbitrary current sensor being inserted in an arbitrary receiving connector, the short pins enter a conductive state, and by detecting that conductive state with a conductive state detection circuit that is included in the sensor unit, it is possible to recognize into which arbitrary position that the current sensor has been inserted.

When a current detection signal from the current sensor is input to the sensor unit by consumption current or power consumption of the load that is connected to the breakers (trunk breaker, branch breakers), that input range (sensitivity, dynamic range) varies depending on the load that is connected. According to an exemplary embodiment of the present invention, due to having a mechanism that can monitor and determine the value of the current detection signal for a fixed time (a period that corresponds to an operation cycle that includes the maximum value and minimum value), and adjust the input range (sensitivity, dynamic range) so as to become an output level having the greatest resolution, it is possible to perform automatic adjustment and accurate current measurement.

For example, the sensor unit includes a resistance circuit that has a plurality of resistors having different resistance values that are connected in parallel, with those resistors connected in series with a current sensor. By selecting any one of the resistors of that resistance circuit, it is possible to adjust the input range of the current detection signal to an optimum value.

EMBODIMENTS FOR CARRYING OUT THE INVENTION

The power consumption management system according to an exemplary embodiment of the present invention shall be described with reference to the drawings.

First, referring to FIG. 5 and FIG. 6, an ordinary configuration of a sensor-equipped power distribution board that shares features with the present exemplary embodiment shall be described. FIG. 5 and FIG. 6 show an ordinary sensor-equipped power distribution board that includes a function of measuring electrical current or power. The power distribution board that is shown in FIG. 5 is constituted by main bars and branch bars. The power distribution board that is shown in FIG. 6 is constituted by main plates and branch plates. FIG. 5 and FIG. 6 show as one example connections of a single-phase three-wire type power distribution board. Hereinbelow, main bars and main plates shall collectively be called main parts. Also, branch bars and branch plates shall collectively be called branch parts. Moreover, main parts and branch parts may sometimes also collectively be called main parts. The main parts L1, L2, N and the branch parts 2 that composed of sheet-shaped copper plates are constituted by three live parts of an L1 pole, an N pole and a L2 pole. By connecting to two among the three main parts L1, L2 and N (that is, the main parts L1 and N, the main parts L2 and N, or the main parts L1 and L2), it is possible to receive the supply of a single-phase 100 V or single phase 200 V power supply.

Figure 1:
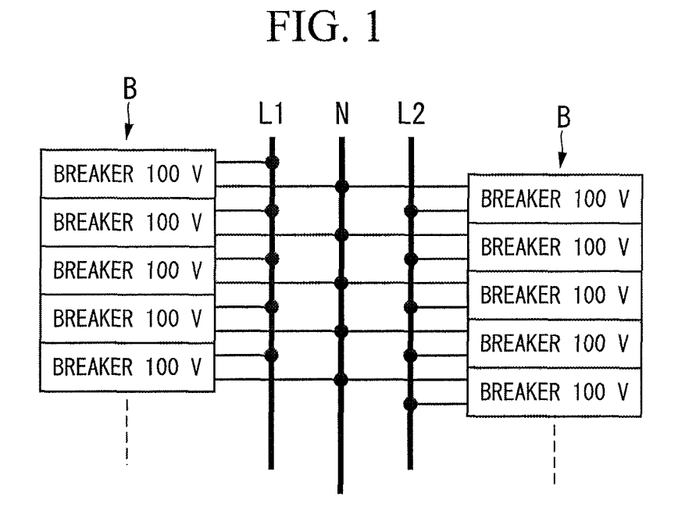
FIG. 1 is a circuit diagram that shows the positions of main parts and breakers.

At the end portions of these main parts L1, L2, and N, a plurality of branch parts 2 are formed in a multi-leg shape so as to project out. These branch parts 2 engage with each of a plurality of concave parts b1, b2 and b3 that a branch breaker B has. FIG. 1 schematically shows an equivalent circuit with this kind of connection state.

The branch breakers B are respectively fitted to the branch parts 2 of two main parts among the three main parts L1, L2 and N to be electrically connected. The two main parts for example are the main parts L1 and N, or the main parts L2 and N. The branch breakers B restrict to a predetermined set value the current that is supplied to the load that is an electrical device that is connected to a power supply.

A current sensor (coil part) CT is installed at the projection parts of the main parts L1, L2 and N, that is to say, the branch parts 2. The current sensor CT includes a core 10 and a secondary coil 11. The core 10 has a ring-shape. Induced current is produced in the core 10 by current that is supplied to the main parts L1, L2 and N. The secondary coil 11 has a linear shape and is wound on the core 10. The secondary coil 11 detects the induced current that is produced by the core 10.

This current sensor CT constitutes a portion of the sensor unit 21 described below. The current sensor CT is attached to the branch bar 2 by inserting the ring-shaped core 10 on the branch bar 2 that is positioned at the end portion of the main parts L1, L2, and N. At this time, to ensure that adjacent cores 10 do not come into contact with each other, the core 10 may be arranged so as to mutually differ with respect to another core 10 that is adjacent by shifting the attachment position of the core 10 with respect to the branch bar 2 in the length direction of the branch bar 2.

Figure 2:
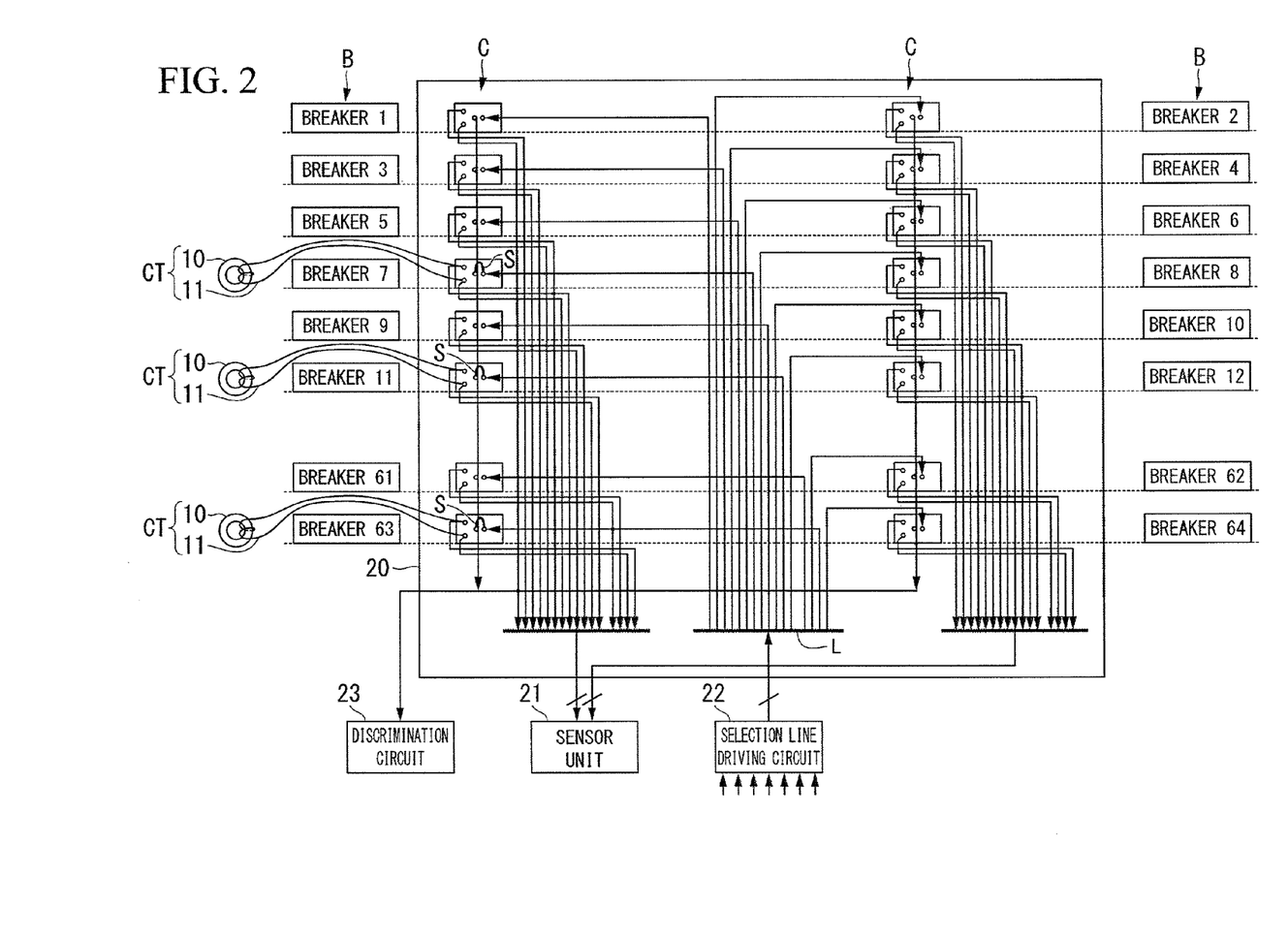
FIG. 2 is a circuit diagram for describing a sense voltage ($V_S$) that is detected by a sensor unit.

As shown in FIG. 2, each end of the secondary coil 11 that includes a linear body is connected to the two terminals of the connector C. The two terminals of the connector C are connected to the sensor unit 21 through wiring on a substrate 20. Also, a sensor unit 21, a selection line driving circuit 22 and a discrimination circuit 23 are connected to this substrate 20.

The connector C is constituted by four terminals. In the case of the wiring of the secondary coil 11 of the current sensor CT being connected to two terminals among these four terminals, the current detection signal of the current sensor CT is supplied to the sensor unit 21 through these two terminals. Also, in the case of the current sensor CT being connected to two terminals among the four terminals, a shorting wire S is provided at the remaining two terminals to put those two terminals in a conduction state.

The connector C is constituted from a transmitting connector and a receiving connector. As a result of the transmitting connector and the receiving connector being coupled, the current sensor CT is coupled to the lines on the substrate 20. However, in the figure, only one connector is shown for the sake of convenience.

In the case of the current sensor (coil part) CT and the shorting wire S being installed in the four terminals of the connector C, the discrimination circuit 23 outputs a signal of "presence of the current sensor CT (high: H)" that indicates the existence of the current sensor CT. Also, the sensor unit 21 takes in the current detection signal from the current sensor CT. Moreover, the selection line driving circuit 22 selects the line L that can be used for the load (electrical device) from the lines L that are identified as "presence of the current sensor CT (high)" by the discrimination circuit 23, and enables power supply via the breaker B of that line L.

In the case of the current sensor CT and the shorting wire S not being installed in the four terminals of the connector C, the output of the discrimination circuit 23 becomes "absence of the current sensor CT (low: L)" not indicating the existence of the current sensor CT. Also, the sensor unit 21 cannot take in the current detection signal from the current sensor CT. Moreover, the selection line driving circuit 22 does not select the line identified as "absence of the current sensor CT (low)" by the discrimination circuit 23 as the line L that can be used for the load (electrical device).

Next, the constitution of the sensor unit 21 shall be described with reference to FIG. 2 and FIG. 3.

As shown in a basic configuration diagram of FIG. 2, the sensor unit 21 calculates the load current ($I_L$) that flows through the branch bar 2 of the main bar 1 by measuring the sense voltage ($V_S$) that is determined based on the value of the secondary current ($I_S$) that is supplied through the secondary coil 11. That is to say, as shown in FIG. 3, the sense voltage ($V_S$) is indicated by the integral of the secondary current ($I_S$) and the sense load resistance value ($R_S$). The relationship of the sense voltage ($V_S$), the secondary current ($I_S$), the sense load resistance value ($R_S$) and the load current ($I_L$) is shown by Equation 1 below. In the following Equation 1, "K" indicates the coupling coefficient, and "N" is the number of turns of the secondary coil.

$V_S$: SENSE VOLTAGE = $I_S$: SECONDARY CURRENT × [Equation 1]

$R_S$: SENSE LOAD RESISTANCE

-continued

= $K$: COUPLING COEFFICIENT ×

$$\frac{I_L: \text{LOAD CURRENT}}{N: \text{NUMBER OF TURNS}} \times$$

OF SECONDARY COIL $R_S$: SENSE LOAD RESISTANCE

As shown in Equation 1 given above, by measuring the sense voltage ($V_S$), it is possible to calculate the load current ($I_L$) that flows through the branch parts 2 of the main parts L1, L2, and N.

Next, a specific circuit configuration in the sensor unit 21 for adjusting the sense voltage ($V_S$) indicated by the aforementioned Equation 1 to an optimum value shall be described.

Figure 3:
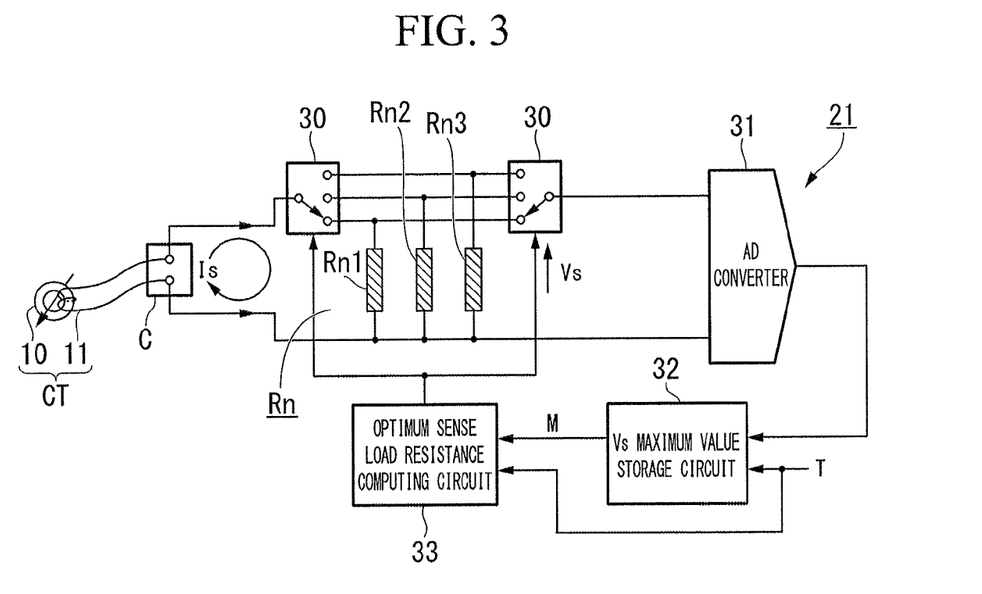
FIG. 3 is a circuit diagram that shows FIG. 2 in concrete terms.

The sensor unit 21 shown in FIG. 3 is provided with a signal processing part that includes a resistance switching part (resistance circuit) 30 that switches the resistors Rn (Rn1 to Rn3), an AD converter 31, a $V_S$ maximum value storage circuit (hereinbelow simply called a storage circuit) 32, and an optimum sense load resistance computing circuit (resistance circuit, hereinbelow simply called a computing circuit) 33.

The resistance value Rs1 of the resistor Rn1 is 10Ω. The resistance value Rs2 of the resistor Rn2 is 100Ω. The resistance value Rs3 of the resistor Rn3 is 1000Ω. The resistance values Rs1 to Rs3 of the resistors Rn1 to Rn3 are just examples, and configuration changes can be made as needed. Moreover, the type of resistor (resistance value) may also be increased as needed in accordance with the situation.

In this sensor unit 21, as the initial stage, in the resistance switching part 30, for example, the sense load resistance value (Rs) is set to "resistance value Rs1 (=10Ω)".

The sense voltage ($V_S$) that becomes the current measurement value is first converted to a digital value by the AD converter 31 to be measured by a voltage measuring part, not shown, of the sensor unit 21. The sense voltage ($V_S$) that is output from the AD converter 31 is outputted to the storage circuit 32. This storage circuit 32 stores the value of the sense voltage ($V_S$) that is input from the AD converter 31 for a fixed period that is set in advance (for example, one day or one hour). Note that a signal T that sets the fixed time (stipulated time) is input to the storage circuit 32 and the computing circuit 33. Moreover, the storage circuit 32 stores the maximum value M of the sense voltage ($V_S$) during the fixed period (the maximum value during the stipulated time).

The maximum value M of the sense voltage ($V_S$) that is stored in this storage circuit 32 is output to the computing circuit 33. The computing circuit 33 selects the optimum sense load resistance value ($R_S$) based on this maximum value M.

Specifically, based on the sense voltage (Vs) that is stored in the storage circuit 32, the computing circuit 33 switches an analog switch (SW) of the resistance switching part 30 to change the sense load resistance value (Rs) so that the sense voltage (Vs) becomes the optimum value that has been set in advance or a value approximate to that.

By performing the switching operation of the resistance switching part 30 by the computing circuit 33, it is possible to dynamically switch the sense load resistance value (Rs) to the value most suited to the input range (sensitivity, dynamic range).

Instead of a system that alternately connects a plurality of fixed sense loads to switch the input range, a system that adjusts the input range using variable resistance may be adopted.

In the power consumption management system as given above, in the case of the current sensor CT and the shorting wire S being installed in the four terminals of the connector C, a signal of "presence of the current sensor CT (high)" that indicates the existence of the current sensor CT is output from the discrimination circuit 23. Also, the current detection signal is taken in by the sensor unit 21 from the current sensor CT. Moreover, in the selection line driving circuit 22, the line L that can be used for the load (electrical device) is selected from the lines L that are identified as "presence of current sensor CT (high) by the discrimination circuit 23, and power supply via the breaker B of that line L becomes possible.

Also, in the sensor unit 21, the sense voltage ($V_S$) is measured based on the secondary current ($I_S$) that is taken in and the sense load resistance value ($R_S$) that is set in advance by the resistance switching part 30. Afterward, the sense voltage ($V_S$) is stored in the storage circuit 32 for the fixed period (for example, one day, one hour) that is set in advance, and the maximum value M during that period is stored. Then, the maximum value of the sense voltage ($V_S$) that is stored in the storage circuit 32 is output to the computing circuit 33. This computing circuit 33 switches the resistance switching part 30 to alter the sense load resistance value (Rs1 to Rs3) so that the sense voltage ($V_S$) becomes the optimum value that has been set in advance. Thereby, the sense load resistance value (Rs) is adjusted so as to become the value most suited to the input range (sensitivity, dynamic range).

The power consumption management system according to the exemplary embodiment described in detail above includes the sensor unit 21 that includes the current sensor (coil part) CT and the signal processing part (resistance switching part 30, AD converter 31, storage circuit 32, and computing circuit 33). The current sensor CT measures the current that is supplied from the main parts L1, L2, N to the breakers B, and outputs a current detection signal based on the measured current. The signal processing part receives the current detection signal detected by the current sensor CT over a predetermined time, determines the range of the signal level from the received current detection signal, and adjusts the input range of the current detection signal in accordance with that determination result. In the signal processing part, regardless of the aspect of the coil-shaped current sensor CT for detecting the current value that flows to the breaker B, it is possible to adjust the input range (sensitivity, dynamic range) to the optimum value. Therefore, it is possible to perform accurate current measurement by the current sensor CT.

For example, the signal processing part includes a resistance circuit (resistance switching part 30, computing circuit 33). The resistance circuit has a plurality of resistors Rn of differing resistance values that are connected in parallel. Those resistors Rn are connected in series with the secondary coil 11. The resistance circuit adjusts the input range of the current detection signal to the optimum value by selecting any one of the resistors Rn. With this constitution, by selecting any one of the plurality of resistors Rn (Rn1 to Rn3) with the resistance circuit, it is possible to adjust the input range of the current detection signal to the optimum value.

Also, the current sensor CT is attached to the branch part 2 of the main parts L1, L2, N2 to which the branch breaker B is attached. With this constitution, attachment of the current sensor CT is easy. As a result, it becomes possible to improve the workability involved in attachment. At this time, after passing the branch part 2 through the hole of the core 10 of the current sensor CT, when the concave part of the branch breaker B is engaged with the distal end of the branch part, during the work of taking the branch from the main wire (the work of causing the branch part 2 to engage with the branch breaker B), simply by passing the branch part 2 through the coil, it is possible to simply attach a sensor for power consumption measurement.

In the exemplary embodiment described above, a connector C with four terminals is used, and by installing a shorting wire S in two terminals of that connector C, the presence of the current sensor CT is detected by the discrimination circuit 23. However, it is not limited to this constitution. A connector C with two terminals as shown in FIG. 4 may be used, and by adopting a structure that does not install the shorting wire S in two terminals of that connector C, the detection of the current sensor CT by the discrimination circuit 23 may be abbreviated.

Figure 4:
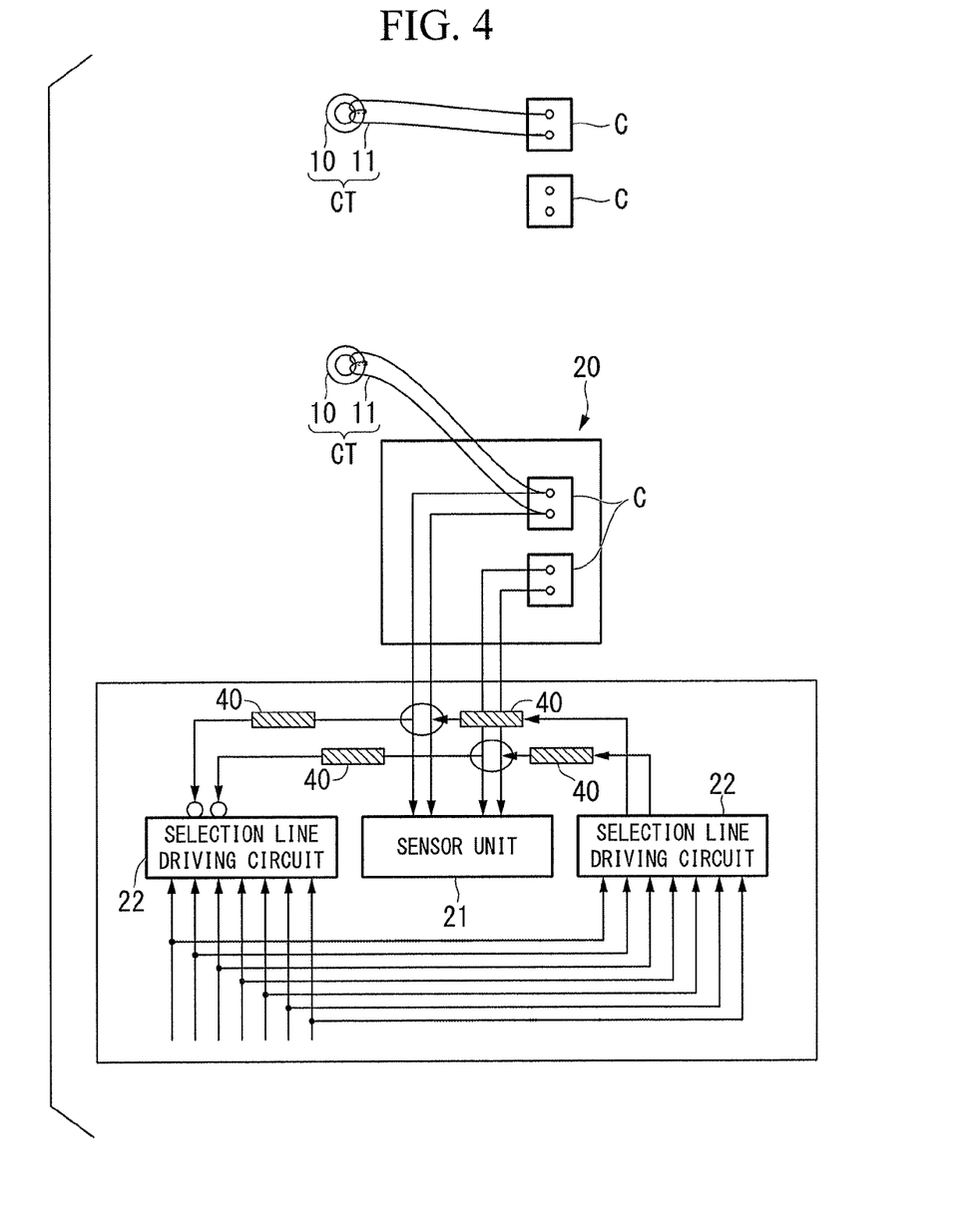
FIG. 4 is a drawing that shows another embodiment of the circuit diagram shown in FIG. 1.

In FIG. 4, the power that is supplied from the main bar 1 to the breaker B is measured by the sensor unit 21 based on the current detection signal that is output from the current sensor CT. Also, the selection line driving circuit 22 flows a constant direct current load current through a resistance load 40 (electrical device) for the line that has the current detection signal that is supplied from the current sensor CT to the sensor unit 21. Due to the input voltage to the sensor unit 22 differing between the case of the current sensor CT being connected and the case of it not being connected, it is possible to measure the current of that line.

Hereinabove, an exemplary embodiment of the present invention has been described in detail with reference to the drawings, but specific configurations are not limited to this exemplary embodiment, and design modifications are also included in a range that does not deviate from the scope of the present invention.

For example, it is possible to use a Hall element instead of a current transformer as the current sensor.

This application is based upon and claims the benefit of priority from Japanese patent application No. 2011-077732, filed Mar. 31, 2011, the disclosure of which is incorporated herein in its entirety by reference.

INDUSTRIAL APPLICABILITY

The power consumption management system according to the present invention can be applied to a power distribution board.

REFERENCE SYMBOLS

L1, L2, N Main part (main bar or main plate)
2 Branch part (branch bar, or branch plate)
3 Sensor unit
11 Secondary coil
21 Sensor unit
30 Resistance switching part (resistance circuit)
33 Optimum sense load resistance computing circuit (resistance circuit)
B Branch breaker
CT Current sensor (coil part)
Rn Resistor

The invention claimed is:
1. A power consumption management system comprising:
a main part that is connected to a power line;
a breaker that is electrically connected to the main part, and limits a current supplied to a load to a predetermined set value; and
a sensor unit including a current sensor and a signal processing part,
wherein the current sensor measures a current supplied from the main part to the breaker, and outputs a current detection signal based on the measured current, the signal processing part receives the current detection signal over a predetermined time, determines a range of a signal level from the received current detection signal, and adjusts an input range of the current detection signal in accordance with the determination result, the current sensor includes a core that produces an induced current by a current that is supplied from the main part to the breaker, and a secondary coil that detects the induced current, and the signal processing part includes a resistance circuit including a plurality of resistors having different resistance values, the resistors being connected in parallel, the resistors being connected in series with the secondary coil, the signal processing part adjusting the input range of the current detection signal to an optimum value by selecting any one of the resistors.

2. The power consumption management system according to claim 1, wherein the main part is provided in a plurality in a mutually parallel manner, and the breaker has a plurality of concave parts that are fitted to the main parts to be connected to a power supply of any phase.

3. The power consumption management system according to claim 1, wherein the current sensor is attached to the branch part of the main part bar where the breaker is installed.

4. A power consumption management system comprising:
a main part that is connected to a power line;
a breaker that is electrically connected to the main part, and limits a current supplied to a load to a predetermined set value; and
a sensor unit including a current sensor and a signal processing part,
wherein the current sensor measures a current supplied from the main part to the breaker, and outputs a current detection signal based on the measured current, and
the signal processing part receives the current detection signal over a predetermined time, determines a range of a signal level from the received current detection signal, and adjusts an input range of the current detection signal in accordance with the determination result,
the current sensor includes a core that produces an induced current by a current that is supplied from the main part to the breaker, and a secondary coil that detects the induced current; and
the signal processing part includes a variable resistance circuit that is connected in series with the secondary coil, the signal processing part adjusting the input range of the current detection signal to an optimum value by changing a resistance value of the variable resistance circuit.

* * * * *